United States Patent
Milshtein et al.

(10) Patent No.: US 6,239,621 B1
(45) Date of Patent: May 29, 2001

(54) TWO LEGGED RESET CONTROLLER FOR DOMINO CIRCUIT

(75) Inventors: Mark S. Milshtein, Hillsboro; Milo D. Sprague, Aloha, both of OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/473,974

(22) Filed: Dec. 29, 1999

(51) Int. Cl.[7] ................................................. H03K 19/096
(52) U.S. Cl. ............................ 326/95; 326/112; 326/119
(58) Field of Search ............................... 326/112, 119, 326/121, 93–98

(56) References Cited

U.S. PATENT DOCUMENTS

| 5,543,735 | * | 8/1996 | Lo ........................................... 326/93 |
| 5,550,490 | * | 8/1996 | Durham et al. ........................ 326/98 |
| 5,724,249 | * | 3/1998 | Kodali et al. .......................... 326/83 |

* cited by examiner

*Primary Examiner*—Michael Tokar
*Assistant Examiner*—Don Phu Le
(74) *Attorney, Agent, or Firm*—Kenyon & Kenyon

(57) ABSTRACT

A method is provided for precharging a node in an integrated circuit in which the node is precharged a first predetermined delay after the node evaluates and, thereafter, the precharge ceases after a second shorter predetermined delay.

24 Claims, 4 Drawing Sheets

100

200

300

TWO LEGGED RESET CONTROLLER FOR DOMINO CIRCUIT

BACKGROUND

The present invention relates to a reset controller for a domino circuit characterized by improved turn off times.

As is known, integrated circuits may include domino circuits that carry active data on only one phase of a driving clock, called the "evaluation phase." During another phase of the clock, the "precharging phase," the domino circuit precharges its output to a predetermined value. A reset circuit in the domino circuit controls the precharging.

An evaluation circuit also is coupled to the output terminal having a data input terminal. If active data is input to the evaluation circuit during the evaluation phase, the evaluation circuit may drive the output terminal from the precharge voltage. The active data typically is removed from the evaluation circuit prior to the precharge phase. The reset circuit precharges the output terminal in preparation for another evaluation phase.

Known reset circuits may include a propagation path that extends from the output terminal to a precharge transistor. An output of the reset circuit drives the gate of the precharge transistor. Such reset circuits typically are characterized by a propagation delay that is sufficient to guarantee that the reset circuit will not cause the precharge transistor to precharge the output terminal at the same time that the evaluation terminal causes the output terminal to be driven to a different potential. If two transistors were permitted to drive the same terminal to two different potentials, it would cause contention and damage to the circuit. Thus, the delay of the reset circuit typically is designed to be large enough so that the precharge transistor is turned on only after the data signal that is input to the evaluation circuit is deactivated.

In known self-resetting domino circuits, the reset circuit that turns on the precharge transistor also turns it off. Thus, after the precharge circuit is activated, it remains activated for the same propagation delay that was designed into the reset circuit to avoid contention.

This feature of reset circuits may be disadvantageous. Although a relatively long delay in turning the precharge transistor on may be necessary to avoid contention at the output terminal, a long delay in turning off the precharge transistor is not necessary. An output terminal may be precharged very quickly relative to the length of the data pulse input to the domino circuit. No known reset circuit provides a different delay for activating a precharge transistor than for deactivating a precharge transistor.

Accordingly, there is a need in the art for a reset circuit in a domino circuit that provides activates a precharge transistor after a first delay but deactivates the precharge transistor after a second, shorter delay.

SUMMARY

According to an embodiment, the present invention provides a method of precharging a node in an integrated circuit in which the node is precharged a first predetermined delay after the node evaluates and, thereafter, the precharge ceases after a second shorter predetermined delay.

DETAILED DESCRIPTION

Embodiments of the present invention provide domino circuit having a self-timed reset circuit in which the reset circuit is characterized by a long delay path to enable the reset precharge and also a short delay path to disable the reset precharge once the reset is activated. An understanding of these embodiments may be facilitated by reference to the figures and the following description.

Figure 1:
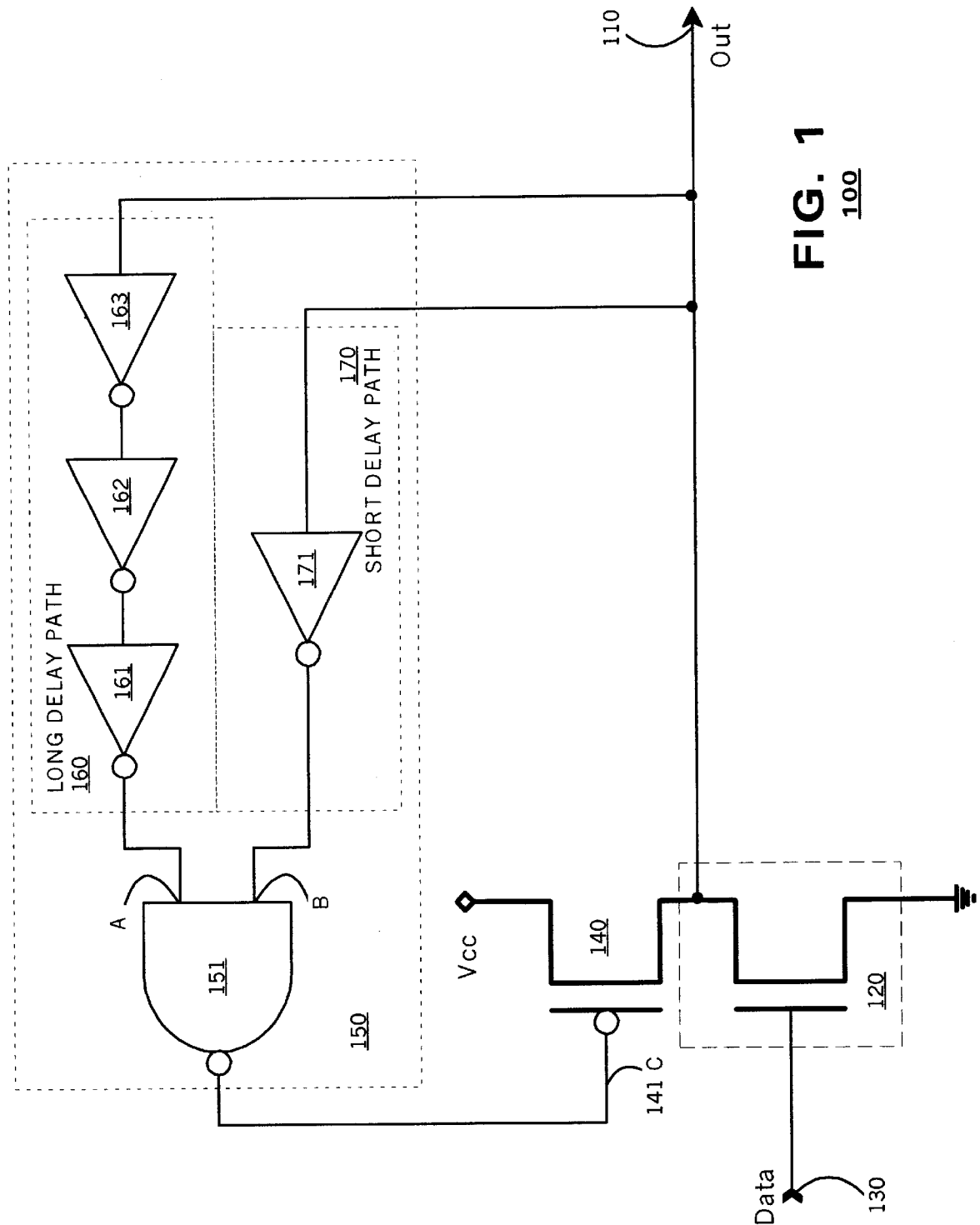
FIG. 1 is a diagram of self-timed atomic circuit constructed in accordance with an embodiment of the present invention.

FIG. 1 is a circuit diagram of a domino circuit 100 according to an embodiment of the present invention. The domino circuit 100 includes an output terminal 110 that is precharged to a predetermined potential (the "precharge" or "standby" potential). In the example of FIG. 1, the output terminal 110 is precharged to $V_{cc}$. The domino circuit 100 includes an evaluate circuit 120 having an input terminal 130. The evaluate circuit 120 couples the output terminal 110 to a second predetermined potential, shown as ground in FIG. 1 (the "evaluation" potential). During the evaluation phase, the evaluate circuit 120 may cause the output terminal 110 to discharge to ground based upon the state of the signal at input terminal 130.

In the example of FIG. 1, the domino circuit 100 is shown as a latch circuit. Of course, as is understood by those of skill, the domino circuit 100 may be designed to accommodate a host of logical functions. As is known, different applications of the present invention may cause the nature and character of the evaluate circuit 120 to deviate from the structure shown in the present invention. Such deviations are within the spirit of the present invention.

The domino circuit 100 also may include a precharge transistor 140 that couples the output terminal 110 to the precharge potential across a source to drain path. A reset circuit 150 couples the gate 141 of the precharge transistor 140 to the output terminal 110. The precharge transistor 140 may be a PMOS transistor that is conductive when the signal applied at the gate 141 goes low. When the precharge transistor 140 is conductive, it pulls the voltage at the output terminal to the precharge potential.

According to an embodiment of the present invention, the reset circuit 150 may be populated by two circuit paths, a "long delay path" 160 and a "short delay path" 170, each extending from the output terminal 110 to the gate 141 of the precharge transistor 140. The two paths each are input to a common NAND gate 151.

The long delay path 160 and the short delay path 170 each may be populated by one or more inverter buffers 161–163, 171. The inverter buffers of each path 160, 170 are interconnected in a cascaded relationship. As is known, each inverter buffer imposes a propagation delay upon an input data signal; the number of inverter buffers in each path 160, 170 determines how much delay the respective path imposes upon a signal as it propagates from the output terminal 110 through the respective path to the NAND gate 151. The NAND gate 151 itself may impose a propagation delay upon an input signal.

In the example of FIG. 1, only one inverter buffer 171 is shown in the short delay path 170 and three inverter buffers 161–163 are shown in the long delay path 160. These numbers are merely exemplary. Typically, the number of inverters in a particular domino circuit 100 will be tuned to the application for which the circuit 100 is to be used.

For notational purposes, the input from the long delay path 160 to the NAND gate 151 is labeled node "A" and the input from the short delay path 170 to the NAND gate 151 is labeled node "B." An output of the NAND gate 151 is input to the gate of the precharge transistor 140 at a node "C."

Figure 2:
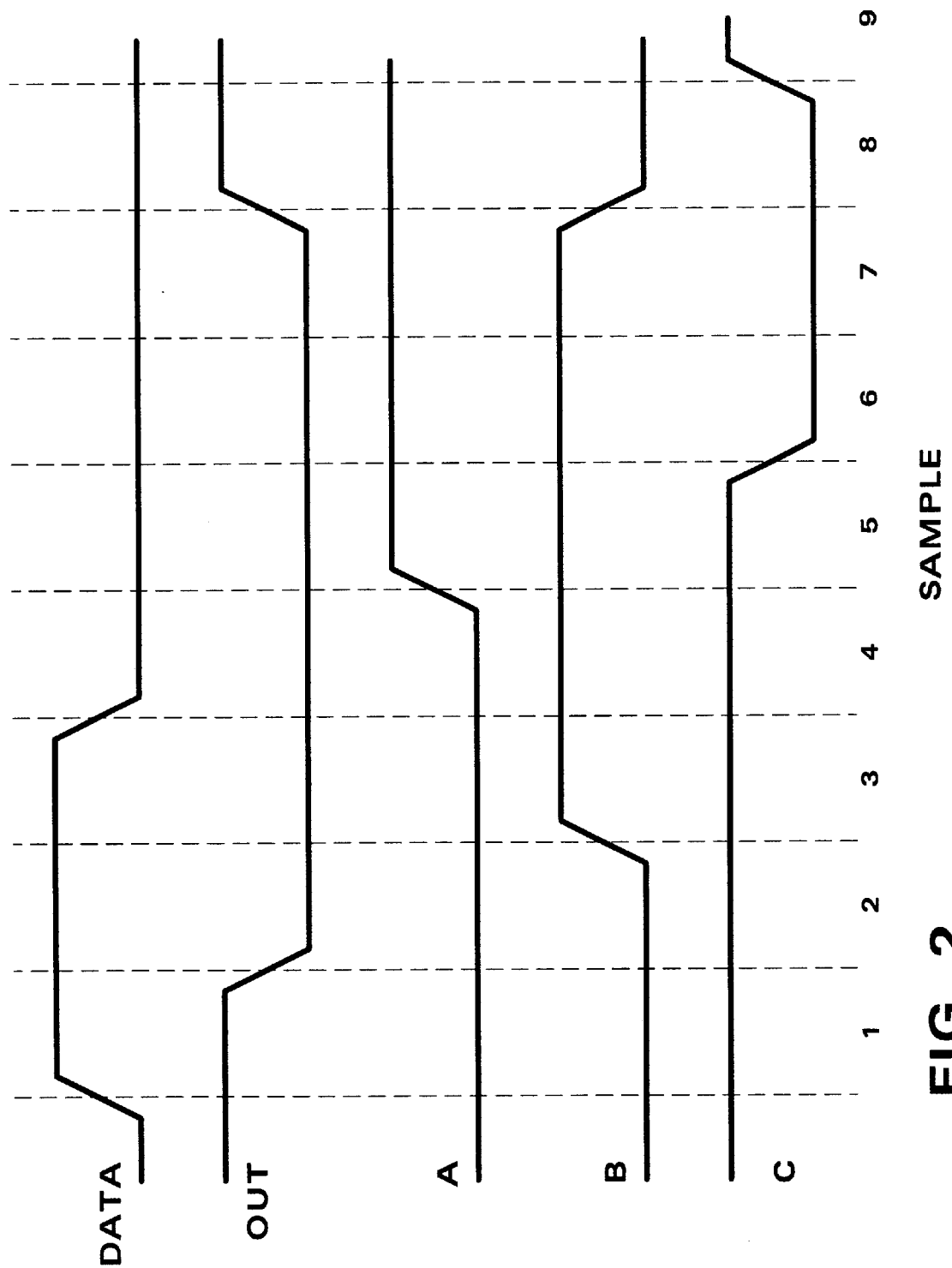
FIG. 2 is a timing diagram of the atomic circuit of FIG. 1 operating in accordance with an embodiment of the present invention.

FIG. 2 is a timing diagram illustrating the state of signals in the domino circuit 100 of FIG. 1 according to an embodiment of the present invention. In the example of FIG. 2, the inverter buffers 161–163, 171 are assumed to impose an identical propagation delay upon a signal. FIG. 2 illustrates signals at the input terminal 130, at nodes A-C and at the output terminal 110. The dashed lines represent time samples measured in units of delay imposed by a single inverter buffer.

During a rest state, the data signal at terminal 120 is precharged to the precharge potential. Assume that the output terminal 110 is precharged to a high state but that no external source maintains the output terminal 110 at such a state. Nodes A and B therefore are low. The input to the precharge transistor 140 (node C), therefore, is high. Thus, both the evaluate circuit 120 and the precharge transistor 140 are nonconductive.

The data signal is shown as evaluating in sample 1. When the data signal evaluates, the evaluate circuit 120 conducts and discharges the output terminal 110 to ground. Thus, the inputs to both the long delay path 160 and the short delay path 170 are low. The exemplary data signal is shown as being low for over three samples. It drives the output terminal 110 to ground during the time that the data signal is in the evaluate state.

At sample 3, the signal at the output terminal 110 will have propagated through the short delay path 170. Thus, node B is shown as being high. But the data signal will not have propagated through the long delay path 160 (Node A remains low). The output of the NAND gate 151 (node C) does not change. The precharge transistor 140 remains nonconductive. The output terminal 110 remains driven to ground by the data signal.

As shown in FIG. 2, sometime during the duration of sample 4, the data signal ceases to evaluate and returns to its high state. The evaluate circuit 120 no longer drives the output terminal 110 low. Although no longer driven to ground, the output terminal 110 will remain at ground until driven by some other potential.

At sample 5, the data signal that was input to the long delay path 160 in sample 1 will have propagated through the long delay path 160. Thus, nodes A and B both are high. The NAND gate 151 goes low and the precharge transistor 140 conducts. When the precharge transistor 140 conducts, the output terminal 110 is driven to the precharge potential. The precharge potential is input to the two paths 160, 170 of the reset circuit 150.

At sample 8, the state change at the output terminal (sample 7) will have been inverted by inverter 171 and input to NAND gate 151. The input from the long delay path 160 does not change. Thus, node B will be low but node A will remain high. The output of the NAND gate 150 (node C) goes high and the precharge transistor 140 ceases to conduct. The output terminal 110 remains at the precharge potential but is no longer driven so. It is precharged and ready for the next evaluation phase.

As shown in FIG. 2, the delay of the long delay path 160 (in combination with delays that may be introduced by the NAND gate 151 and precharge transistor 140) determines the time when the precharge transistor 140 precharges the output terminal 110. Typically, the delay path 160 may be tuned to a period that is longer than the duration of the input data pulse so as to ensure there will be no contention between the evaluate circuit 120 and the precharge transistor 140. Such tuning may require calibrating a number of inverter buffers in the delay path 160 to introduce a desired propagation delay to the path.

Also as shown in FIG. 2, the delay of the short delay path 170 (again, in combination with delays that may be introduced by the NAND gate 151 and precharge transistor 140) determines the time after the precharge begins when the precharge transistor 140 ceases to precharge the output terminal. In an embodiment, this path may be tuned to maintain the precharge transistor 140 conductive only so long as may be required to precharge the output terminal 100. Such an embodiment increases the speed at which the domino circuit 100 may receive a new data signal and, therefore, increases the throughput of the system as a whole.

Figure 3:
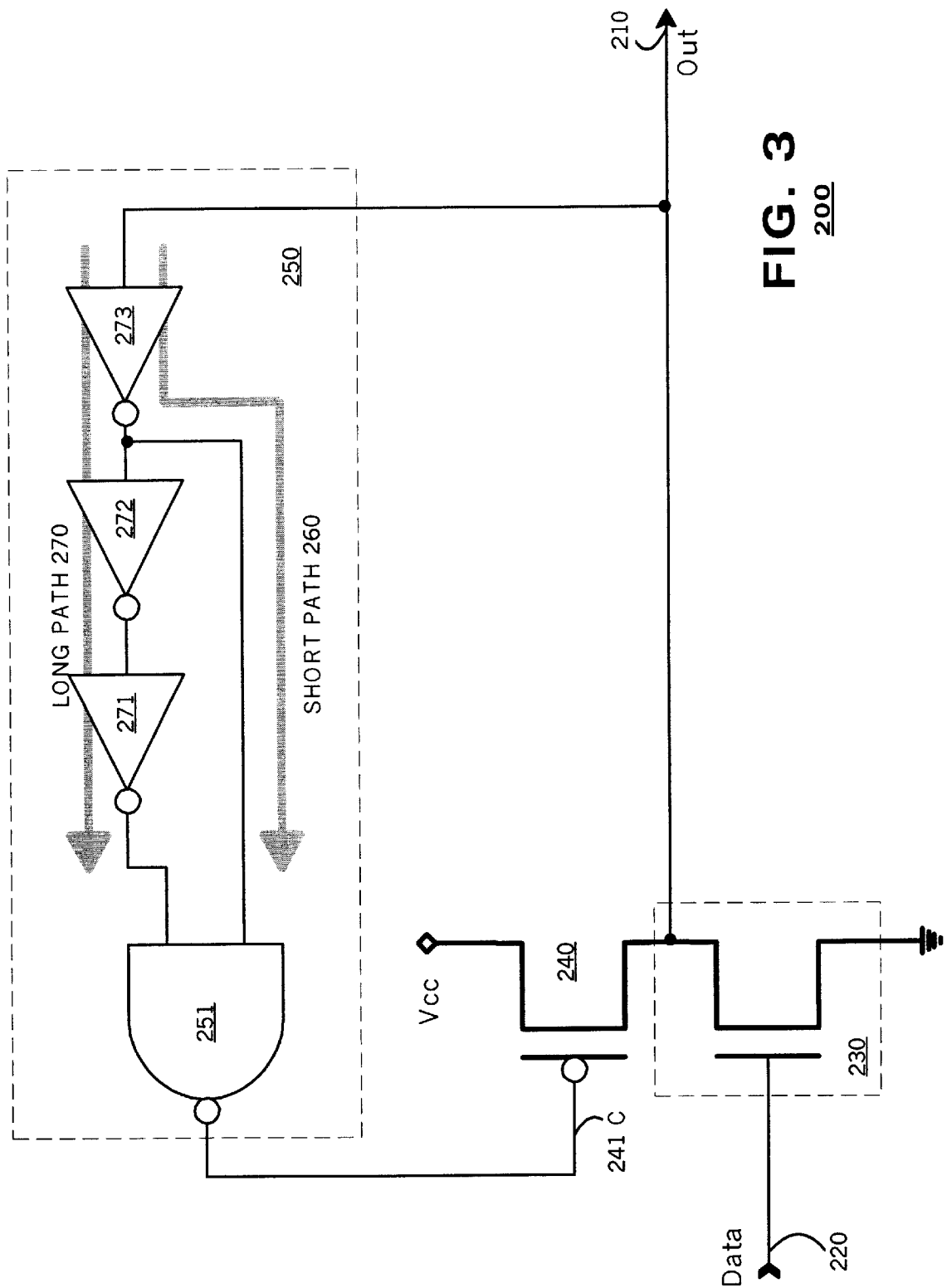
FIG. 3 is diagram of a self-timed atomic circuit constructed in accordance with another embodiment of the present invention.

FIG. 3 illustrates a domino circuit 200 constructed in accordance with another embodiment of the present invention. The domino circuit 200 may be populated by an output terminal 210 and input terminal 220. An evaluate circuit 230 couples the output terminal to an evaluation potential (such as ground) and a precharge transistor 240 couples the output terminal to a precharge potential (such as $V_{cc}$). A reset circuit 250 couples the output terminal to the gate of the precharge circuit.

According to an embodiment of the present invention, the reset circuit 250 provides a short delay path 260 and a long delay path 270 from the output terminal 210 to the gate 241 of the precharge transistor 240. A NAND gate 251 receives inputs from the two delay paths 260, 270 and has an output coupled to the gate 241 of the precharge transistor 240. The long delay 270 path includes a cascaded chain of inverter buffers 271–273 extending from the output terminal 210 to the NAND gate 251. The short delay path 260 provides a shunt path from an intermediate point in the chain of inverter buffers to a second input of the NAND gate 251. In the exemplary reset circuit 250 of FIG. 3, an output of the first inverter buffer 273 is input directly to the NAND gate 241. Thus the short delay path 260 includes a fewer number of inverter buffers than would the long delay path 270.

The embodiment of FIG. 3 operates in a similar manner to the embodiment of FIG. 1 particularly as it relates to the signals and timing shown in FIG. 2. However, the embodiment of FIG. 3 includes fewer inverter buffers than that of FIG. 1. Thus, the embodiment of FIG. 3 may be preferable for use in integrated circuits where it is desired to conserve elements and chip area.

Figure 4:
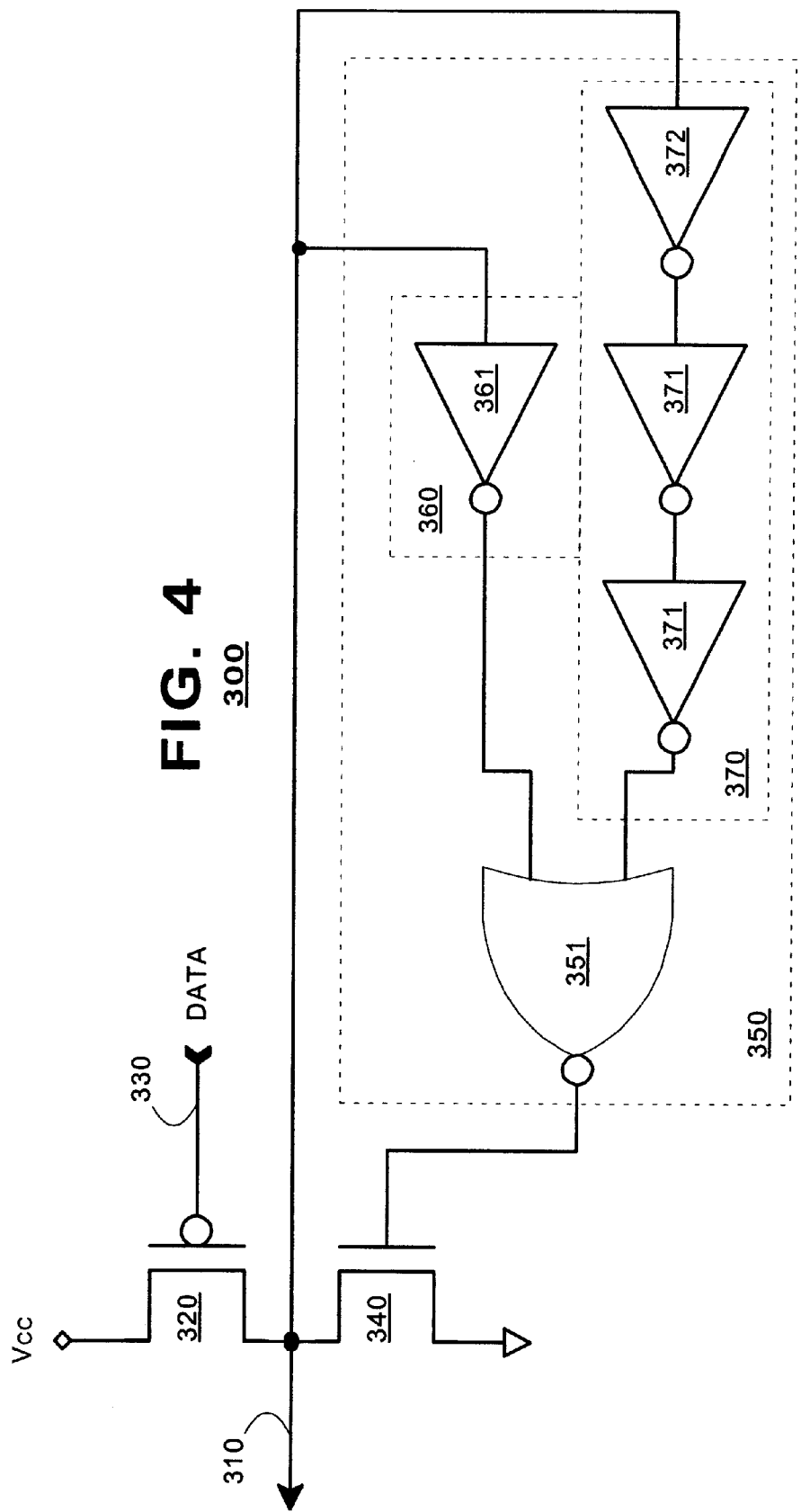
FIG. 4 is diagram of a self-timed atomic circuit constructed in accordance with yet another embodiment of the present invention.

FIG. 4 illustrates a domino circuit 300 according to yet another embodiment of the present invention. FIG. 4 illustrates use of the present invention in an embodiment where the precharge potential is $V_{ss}$ (ground) and the evaluation potential is $V_{cc}$. The domino circuit 300 may include an output terminal 310, an evaluation circuit 320, an input terminal 330 and a precharge circuit 340.

The domino circuit further may include a reset circuit 350 having a short delay path 360 and a long delay path 370. Each delay chain may include a chain of cascaded inverter buffers, each chain having an input coupled to the output terminal 310. The short delay path 360 may include a smaller number of inverter buffers than the long delay path. Outputs of the two delay chains 360, 370 may be input to a NOR gate 351. An output of the NOR gate may be input to the precharge circuit 340.

Several embodiments of the present invention are specifically illustrated and described herein. However, it will be appreciated that modifications and variations of the present invention are covered by the above teachings and within the purview of the appended claims without departing from the spirit and intended scope of the invention.

We claim:

1. A precharge circuit for a node in an integrated circuit, comprising:
    a precharge transistor coupling the node to a precharge potential, and
    a reset circuit coupling the node to a gate of the precharge transistor, the reset circuit comprising:
        a long delay path extending from the node to the gate to turn on the precharge transistor, and
        a short delay extending from the node to the gate to turn off the precharge transistor.

2. The precharge circuit of claim 1, wherein the long delay path comprises a plurality of cascaded inverter buffers.

3. The precharge circuit of claim 2, wherein the short delay path comprises a second plurality of inverter buffers, the second plurality being fewer than the first plurality.

4. The precharge circuit of claim 2, wherein the long delay path further comprises a NAND gate, provided on an output of the last of the cascaded inverter buffers.

5. The precharge circuit of claim 4, wherein the short delay path includes a short path from the output of an intermediate inverter buffer in the long delay path to an input of the NAND gate.

6. The precharge circuit of claim 2, wherein the long delay path further comprises a NOR gate, provided on an output of the last of the cascaded inverter buffers.

7. The precharge circuit of claim 6, wherein the short delay path includes a short path from the output of an intermediate inverter buffer in the long delay path to an input of the NOR gate.

8. The precharge circuit of claim 1, wherein the long and short delay paths each are input to a NAND gate, an output of the NAND gate being input to the gate of the precharge transistor.

9. The precharge circuit of claim 1, wherein the precharge potential is $V_{cc}$.

10. The precharge circuit of claim 1, wherein the precharge potential is ground.

11. A domino circuit, comprising
    an evaluation circuit having input and output terminals,
    a precharge transistor coupling the output terminal to a potential, and
    a reset circuit coupling the output terminal to a gate of the precharge transistor, the reset circuit comprising:
        a long delay path extending from the node to the gate to turn on the precharge transistor, and
        a short delay path extending from the node to the gate to turn off the precharge transistor.

12. The domino circuit of claim 11, wherein the long delay path comprises a plurality of inverter buffers.

13. The domino circuit of claim 12, wherein the short delay path comprises a second plurality of inverter buffers, the second plurality being fewer than the first plurality.

14. The domino circuit of claim 12, wherein the long delay path further comprises a NAND gate provided on an output of the last of the cascaded inverter buffers.

15. The domino circuit of claim 14, wherein the short delay path includes a short path from the output of an intermediate inverter buffer in the long delay path to an output of the NAND gate.

16. The domino circuit of claim 11, wherein the long and short delay paths terminate in a same NAND gate, an output of the NAND gate being input to the gate of the precharge transistor.

17. A method of precharging a node in an integrated circuit, comprising
    when the node evaluates, precharging the node after a first predetermined delay, and
    thereafter, ceasing to precharge the node after a second predetermined delay,
    wherein the first predetermined delay is greater than the second predetermined delay.

18. The method of claim 17, wherein the node evaluates in response to a pulsed input data signal and the first predetermined delay is longer than the pulsed input data signal.

19. The method of claim 17, wherein the second predetermined delay is a delay sufficient to bring the node to a precharged state.

20. A method of precharging a output terminal of a domino circuit, comprising:
    receiving a pulsed evaluate signal, the evaluate signal causing the output terminal to evaluate,
    after a first predetermined delay, precharging the output terminal,
    after a second predetermined delay measured from the conclusion of the first predetermined delay, ceasing to precharge the output terminal.

21. The method of claim 20, wherein the first predetermined delay is greater than the deviation of the pulsed evaluate signal.

22. The method of claim 20, wherein the second predetermined delay is a delay sufficient to bring the output terminal to a precharged state.

23. A domino circuit, comprising:
    an output terminal,
    a precharge circuit coupled to the output terminal, and
    a reset circuit comprising a chain of inverter buffers, an input of which is coupled to the output terminal, and a NAND gate having as inputs an output from a last inverter buffer in the chain and an output from another inverter buffer in the chain, an output of the NAND gate being coupled to the precharge circuit.

24. A domino circuit, comprising:
    an output terminal,
    a precharge circuit coupled to the output terminal, and
    a reset circuit comprising a chain of inverter buffers, an input of which is coupled to the output terminal, and a NOR gate having as inputs an output from a last inverter buffer in the chain and an output from another inverter buffer in the chain, an output of the NOR gate being coupled to the precharge circuit.

* * * * *